US009589664B2

(12) United States Patent
Lou

(10) Patent No.: US 9,589,664 B2
(45) Date of Patent: Mar. 7, 2017

(54) GATE DRIVER, ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Tenggang Lou, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 4 days.

(21) Appl. No.: 14/690,314

(22) Filed: Apr. 17, 2015

(65) Prior Publication Data
US 2016/0189794 A1  Jun. 30, 2016

(30) Foreign Application Priority Data
Dec. 29, 2014  (CN) .......................... 2014 1 0848960

(51) Int. Cl.
*G11C 19/28* (2006.01)
*G02F 1/1345* (2006.01)
(Continued)

(52) U.S. Cl.
CPC ........... *G11C 19/28* (2013.01); *G09G 3/3266* (2013.01); *G09G 3/3674* (2013.01);
(Continued)

(58) Field of Classification Search
CPC ............... G09G 3/3674; G09G 3/3266; G09G 2310/0286; G09G 2300/0426;
(Continued)

(56) References Cited

U.S. PATENT DOCUMENTS

| 2007/0164972 A1 | 7/2007 | Chang | |
|---|---|---|---|
| 2011/0102388 A1 | 5/2011 | Chin | |
| 2012/0050234 A1* | 3/2012 | Jang | ..................... G09G 3/3225 345/204 |

FOREIGN PATENT DOCUMENTS

| CN | 101494032 A | 7/2009 |
|---|---|---|
| CN | 101625837 A | 1/2010 |

(Continued)

*Primary Examiner* — Alexander Eisen
*Assistant Examiner* — Abhishek Sarma
(74) *Attorney, Agent, or Firm* — Anova Law Group, PLLC

(57) ABSTRACT

The present disclosure discloses a gate driver, an array substrate, a display panel and a display device so as to address problems in the gate driver that some shift register units become abnormal so that a succeeding shift register unit depending upon the shift register unit may not be triggered and consequently the entire GOA circuit may operate improperly and even become inoperative. The gate driver includes N shift register units, each of which is connected with respective one of N gate lines of a display panel, and a plurality of gate units. While a gate unit is enabled, the gate unit is configured to provide a current gate line with an output signal of a corresponding shift register unit connected to a preceding gate line and/or a corresponding shift register unit connected to a succeeding gate line.

11 Claims, 13 Drawing Sheets

(51) Int. Cl.
*G09G 3/36* (2006.01)
*G09G 3/32* (2016.01)

(52) U.S. Cl.
CPC ............... *G09G 2300/0426* (2013.01); *G09G 2310/0205* (2013.01); *G09G 2310/0281* (2013.01); *G09G 2310/0286* (2013.01)

(58) Field of Classification Search
CPC .... G09G 2310/0281; G09G 2310/0205; G02F 1/13454; G11C 19/28
See application file for complete search history.

(56) References Cited

FOREIGN PATENT DOCUMENTS

| | | |
|---|---|---|
| CN | 103926767 A | 7/2014 |
| CN | 103985366 A | 8/2014 |

* cited by examiner

(12) United States Patent

GATE DRIVER, ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410848960.3, filed with the Chinese Patent Office on Dec. 29, 2014 and entitled "GATE DRIVER, ARRAY SUBSTRATE, DISPLAY PANEL AND DISPLAY DEVICE", the content of which is incorporated herein by reference in its entirety,

FIELD OF THE INVENTION

The present disclosure relates to the field of display technology, and particularly to a gate driver, an array substrate, a display panel and a display device.

BACKGROUND OF THE INVENTION

Liquid Crystal Displays (LCDs) or Organic Light-Emitting Diode (OLED) displays are increasingly replacing traditional Cathode Ray Tube (CRT) displays in some applications due to their low radiation, small volume, low power consumption and other advantages. Thus, LCDs or OLEDs have been widely applied to notebook computers, Personal Digital Assistants (PDAs), flat panel TV sets, mobile phones and other information products. In the traditional liquid crystal display, a chip on a panel is driven by an external driver chip to display an image, but in order to reduce the number of elements and the production cost, the driver has been developed gradually in recent years by being fabricated directly on the display panel, for example, in such a scheme a gate driver is integrated on a Gate driver On Array (GOA).

As compared with the traditional Chip On Flex/Film (COF) and Chip On Glass (COG) processes, the GOA technology may save the cost and enable both sides of the panel to be symmetric, and this technology is primarily characterized in that GOA units are triggered consecutively to function as shift registers, so as to dispense with an bounding area of gated Integrated Circuits (Ws) and a space for Fan-out wiring, to thereby realize a design of a narrow edge frame; and moreover a bonding process in the direction of gates may be saved to thereby improve the yield and the qualified ratio.

The gate driver in the GOA technology has been optimized in the prior art to thereby ensure a stable output. For example, in order to prevent a timing from becoming out of order due to a delayed clock signal or another reason, in the GOA technology the respective shift register units output sequentially, and the respective clock signals have duty ratios below 50% and overlap sequentially by less than half the width of a pulse, so that an output signal of a current shift register unit overlaps with an output signal of a preceding shift register unit by less than half the width of a pulse. However there may be still a problem with the gate driver in the GOA circuit in some cases, for example, in the GOA circuit, some shift register units depend upon an output signal of a shift register unit preceding thereto, and takes the output signal of the shift register unit preceding thereto as an input signal of the current shift register unit, and if the shift register unit preceding thereto fails or is invalid so that the output signal of the preceding shift register unit becomes abnormal, then the current and succeeding shift register units may not output any signal normally, that is, the entire GOA circuit may operate improperly and even become inoperative.

BRIEF SUMMARY OF THE INVENTION

An embodiment of the present disclosure provides a gate driver including N shift register units, each of which is connected with respective one of N gate lines of a display panel, wherein the gate driver includes a plurality of gate units, and while a gate unit is enabled, the gate unit is configured to provide a current gate line with an output signal of a corresponding shift register unit connected to a preceding gate line and/or a corresponding shift register unit connected to a succeeding gate line, N is an integer greater than 2.

An embodiment of the present disclosure provides an array substrate including: a display area in which N gate lines are disposed, and a non-display area surrounding the display area, wherein the gate driver according to the embodiment above is disposed in the non-display area.

An embodiment of the present disclosure provides a display panel including the array substrate according to the embodiment above.

An embodiment of the present disclosure provides a display device including the display panel according to the embodiment above.

DETAILED DESCRIPTION OF THE INVENTION

Figure 1A:
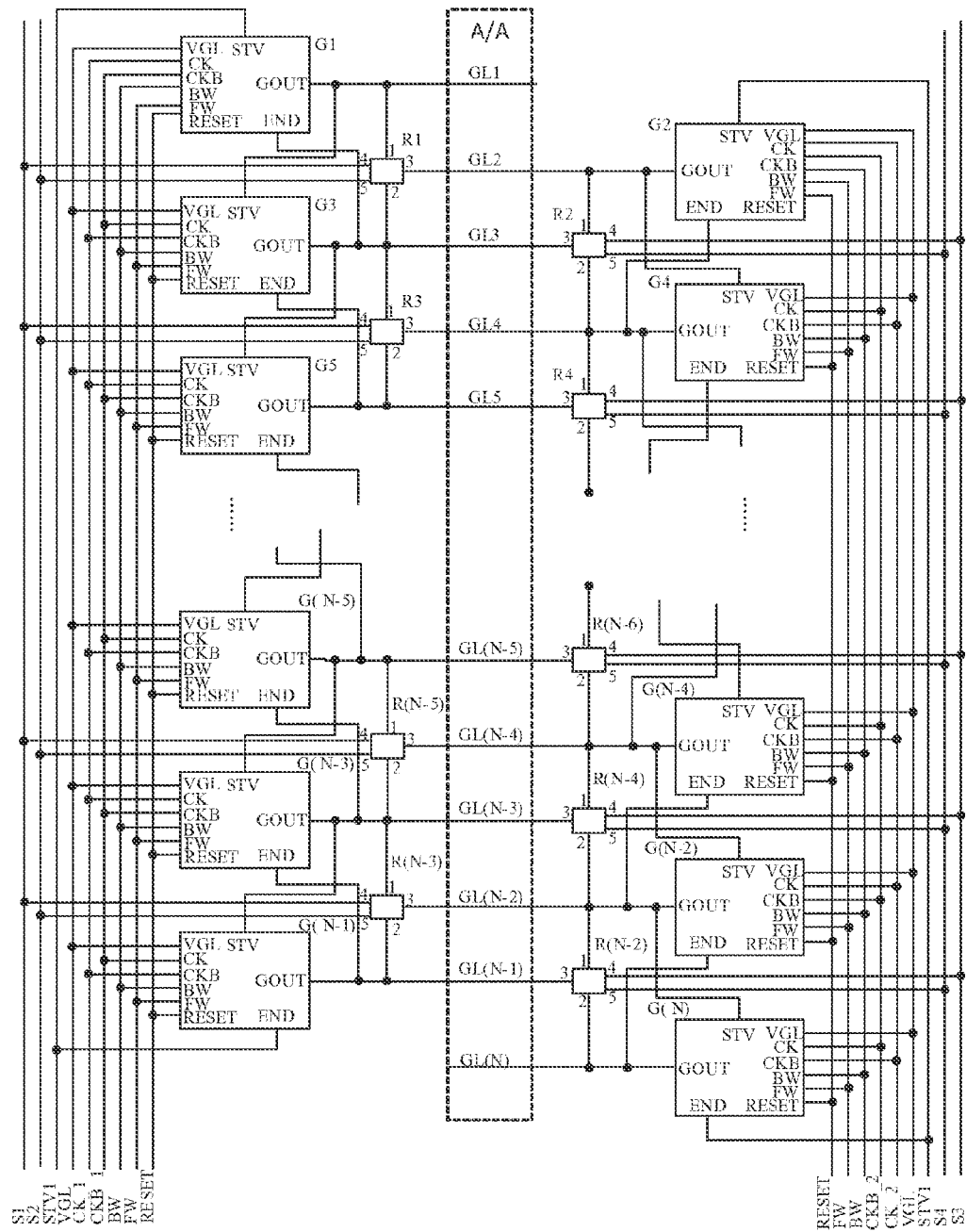
FIG. 1A illustrates a schematic diagram of a gate driver according to an embodiment of the present disclosure.

Implementations of embodiments of the present disclosure will be described below in details with reference to the drawings. It shall be noted that identical or like reference numerals throughout the drawings denote identical or like elements or functionally identical or like elements. The embodiments described below with reference to the drawings are illustrative and merely intended to explain the present disclosure but not construed to limit the present disclosure.

An embodiment of the present disclosure provides a gate driver including N shift register units, each of which is connected with respective one of N gate lines of a display, panel, and a plurality of gate units, and while a gate unit is enabled, the gate unit is configured to provide a current gate line with an output signal of a corresponding shift register unit connected to a preceding gate line and/or a corresponding shift register unit connected to a succeeding gate tine, N is an integer greater than 2.

In an embodiment of the present disclosure, the plurality of gate units are disposed in the gate driver, and when the corresponding shift register unit connected with the current gate line becomes abnormal, corresponding one of the gate units provides the current gate line with the output signal of the corresponding shift register unit connected to the preceding gate line and/or the corresponding shift register unit connected to the succeeding gate tine, to thereby improve the ability to repair the gate driver, and avoid the entire GOA circuit from operating improperly or becoming inoperative due to some abnormal shift register unit.

The gate units in the gate driver according to an embodiment of the present disclosure include the following elements:

A gate unit may include two TFTs which may be two N-type TFTs in series or two P-type TFTs in series or an N-type TFT and a P-type TFT in series; or a gate unit may include a TFT, and the TFTs of all the gate units are N-type TFTs or P-type TFTs, or the odd gate units are N-type/P-type TFTs and the even gate units are P-type/N-type TFTs.

Figure 1B:
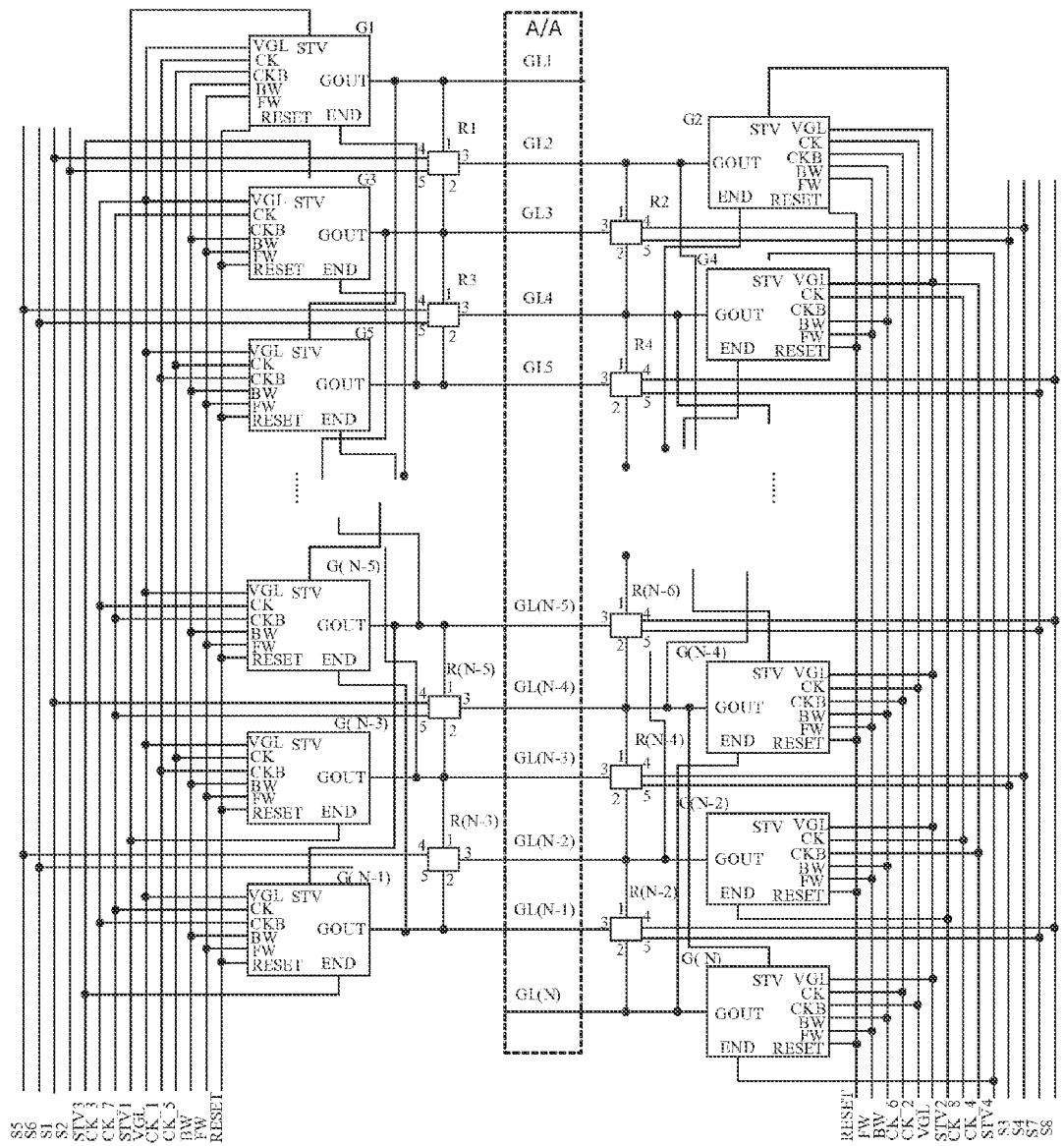
FIG. 1B illustrates a schematic diagram of a gate driver according to another embodiment of the present disclosure.

FIG. 1A illustrates a gate driver according to an embodiment of the present disclosure. The gate driver includes:

N shift register units, each of which is connected with respective one of N gate lines of a display panel, herein the N shift register units are denoted as G1, G2, G3, . . . , G(N−2), G(N−1) and G(N) and the N gate lines are denoted as GL1, GL2, GL3, . . . , GL(N−2), GL(N−1) and GL(N); and N−2 gate units, e.g., R1, R2, R3, . . . , R(N−4), R(N−3) and R(N−2), herein a gate unit R(h) is disposed between the h-th shift register unit G(h) and the (h+2)-th shift register unit G(h+2), first end 1 of the h-th gate unit R(h) is connected with an output signal end Gout of the h-th shift register unit G(h), a second end 2 of the h-th gate unit R(h) is connected with an output signal end Gout of the (h+2)-th shift register unit G(h+2), and a third end 3 of the h-th. gate unit R(h) is connected with the (h+1)-th gate line GL(h+1); and the enabled h-th gate unit R(h) provides the (h+1)-th gate line GL(h+1) sequentially with output signals of the h-th shift register unit G(h) and the (h+2)-th shift register unit G(h+2), herein h=1, 2, 3, . . . , N-2. For example, a gate unit R2 is disposed between the second shift register unit G2 and the fourth shift register unit G4, a first end 1 of the second gate unit R2 is connected with an output signal end Gout of the second shift register unit G2, a second end 2 of the second gate unit R2 is connected with an output signal end Gout of the fourth shift register unit G4, and a third end 3 of the second gate unit R(h) is connected with the third gate line GL3; and the enabled second gate unit R2 provides the third gate line GU sequentially with output signals of the second shift register unit G2 and the fourth shift register unit G4, and the same connection logic will apply to the other respective gate units, although a repeated description thereof will be omitted here. The gate units are enabled by pulse signals provided on enabling signal lines S1, S2, S3 and S4, and the enabling signal lines are connected with first control ends 4 or second control ends 5 of the respective gate units, In an embodiment, in order to enable the gate driver to operate normally, the shift register units further need to be provided with, for example, initial trigger signal lines (a first initial trigger signal line STV1 and a second initial trigger signal line STV2 as illustrated in FIG. 1A), a reset signal line RESET, a low level signal line VGL, a forward scan signal line FW, a backward scan signal line BW, a clock signal line CK_L, a clock signal line CKB_L, a clock signal line CK_R and a clock signal line CKB_R; but the number and connection relationship of these signal lines will not be limited to those as illustrated in FIG. 1A, and the respective signals, and the number of signal lines on which the respective signals are provided, as described above will vary with a variable structure of the shift register units. For example, FIG. 1B illustrates another gate driver, which is a gate driver controlled by an 8-phase clock signal, provided with clock signal lines (e.g., a clock signal line CK0, a clock signal line CK1, a clock signal line CK2, . . . , a clock signal line CK6 and a clock signal line CK7), four initial trigger signal lines (e.g., a first initial trigger signal line STV1, a second initial trigger signal line STV2, a third initial trigger signal line STV3 and a fourth initial trigger signal line STV4). It shall be noted that with a larger number of clock signals (i.e., with a larger number of clock signal lines, e.g., 8 clock signals, 16 clock signals, 32 clock signals or more clock signals), the gate units R1, R2, R3, . . . , R(N−4), R(N−3) and R(N−2) match with the gate driver in the same relationship as in FIG. 1A, that is, the respective gate units are connected with the respective shift register units in the same relationship; and a larger number of enabling signal lines will be provided accordingly for a. larger number of clock signals (e.g., the enabling signal line S1 to the enabling signal line S8 as illustrated in FIG. 1B). Thus numerous variants can be made without departing from the spirit of the gate driver as illustrated in FIG. 1A or FIG. 1B as long as a larger number of enabling signals are provided accordingly for a larger number of clock signals.

Figure 2:
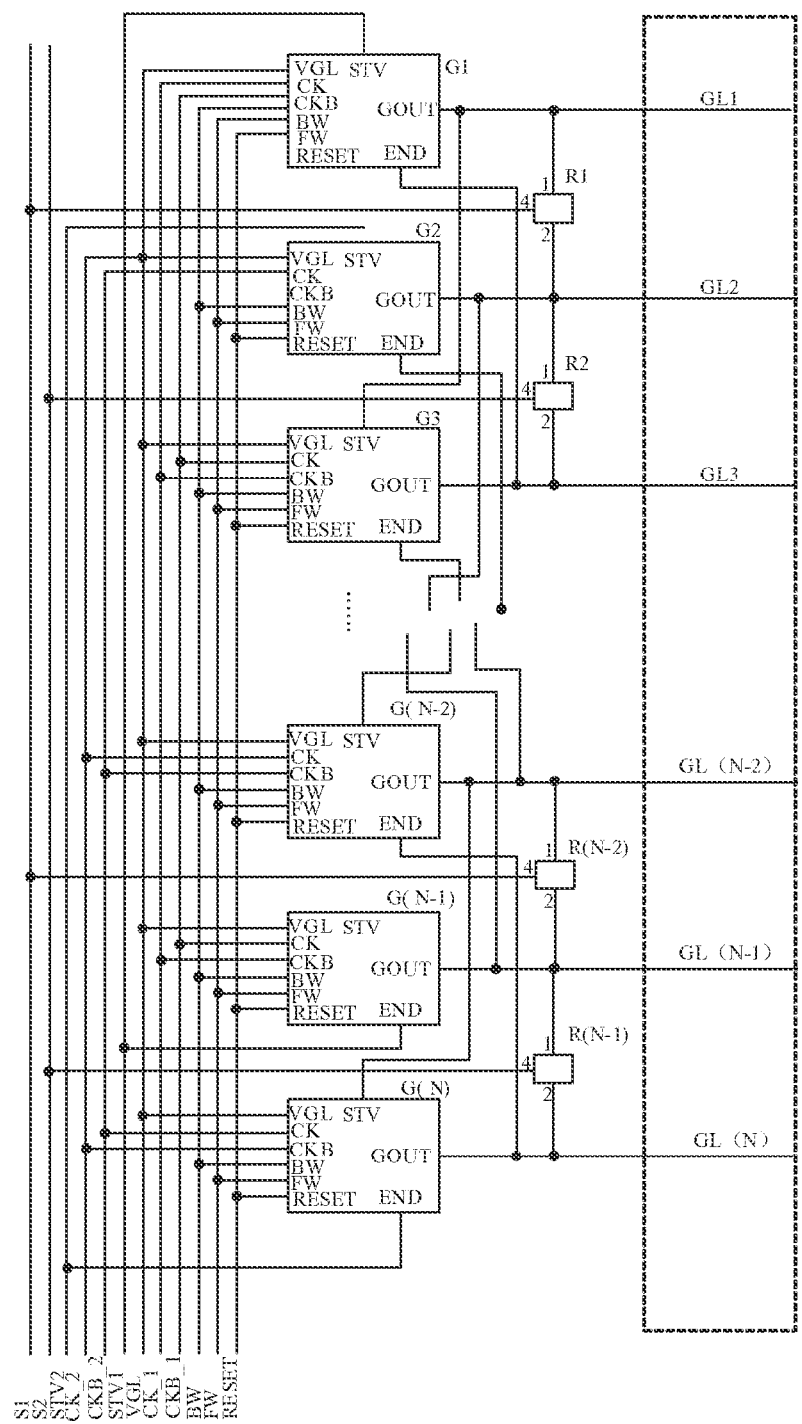
FIG. 2 illustrates a schematic diagram of a gate driver according to another embodiment of the present disclosure.

Referring to FIG. 2, a gate driver according to another embodiment of the present disclosure is illustrated. The gate driver includes:

N shift register units, each of which is connected with respective one of N gate lines of a display panel, herein the N shift register units are denoted as G1, G2, G3, . . . , G(N−2), G(N−1) and G(N) and the N gate lines are denoted as GL1, GL2, GL3, . . . , GL(N−2), GL(N−1) and GL(N); and N-1 gate units, e.g., R1, R2, R3, . . . , R(N−3), R(N−2) and R(N−1), herein a gate unit R(k) is disposed between the k-th shift register unit G(k) and the (k+1)-th_ shift register unit G(k+1), both a second end 2 of the k-th gate unit R(k) and a first end 1 of the (k+1)-th gate unit R(k+1) are connected with the (k+1)-th gate line GL(k+1), a first end 1 of the k-th gate unit R(k) is connected with an output signal end Gout of the k-th shift register unit G(k), and a second end 2 of the (k+1)-th gate unit is connected with an output signal end Gout of the (k+2)-th shift register unit G(k+2); and the enabled k-th gate unit R(k) and (k+1)-th gate unit R(k+1) provide the (k+1)-th gate line GL(k+1) with output signals of the k-th shift register unit G(k) and the (k+2)-th shift register unit G(k+2) sequentially, herein k=1, 2, 3, N−1. For example, both a second end 2 of the second gate unit R2 and a first end 1 of the third gate unit R3 are connected with the third gate line GL3, both a first end 1 of the second gate unit R2 is connected with an output end Gout of the second shift register unit G2, and a second end 2 of the third gate unit R3 is connected with an output end Gout of the fourth shift register unit G4; and the enabled second gate unit R2 and third gate unit R3 provide the third gate line GL3 with output signals of the second shift register unit G2 and the fourth shift register unit G4 sequentially, and the same connection logic will apply to the other respective gate units, although a repeated description thereof will be omitted here. The gate units are enabled by pulse signals provided on enabling signal lines S1 and S2 connected with first control ends 4 of the respective gate units as needed for a design.

In an embodiment, in order to enable the gate driver to operate normally, the shift register units further need to be provided with, for example, a first initial trigger signal STV1, a second initial trigger signal STV2, a reset signal RESET, a low level signal VGL, a forward scan signal FW, a backward scan signal BW, a clock signal CK_1, a clock signal CKB_1, a clock signal CK_2 and a clock signal CK_B2; and the respective signals, and the number of signal lines on which the respective signals are provided, as described above will vary with a variable structure of the shift register units, although a repeated description thereof will be omitted here.

For a gate unit including different elements, the gate driver according to the embodiment of the present disclosure controls whether to enable the gate unit in at least one control mode, for example, when the gate unit does not need to operate, a disabling signal is provided on one or more signal lines, and when the gate unit needs to operate, a pulse signal is provided on one or more signal lines, herein the disabling signal may be provided on the same signal line or lines as the pulse signal, as long as the different signals are provided in different states or in different periods of time; and in another example, the gate driver includes different signal lines on which the disabling signal and the pulse signal are provided respectively, and in this case, in order to enable the gate unit to operate, the gate unit needs to be disconnected from the signal line or lines on which the disabling signal is provided, and the gate unit is connected with the signal line or the lines on which the pulse signal is provided. For the sake of a more clear description of the mode in which the gate unit including different elements is enabled, this will be described below in connection with gate drivers as illustrated in FIG. 3A to FIG. 8.

Figure 3A:
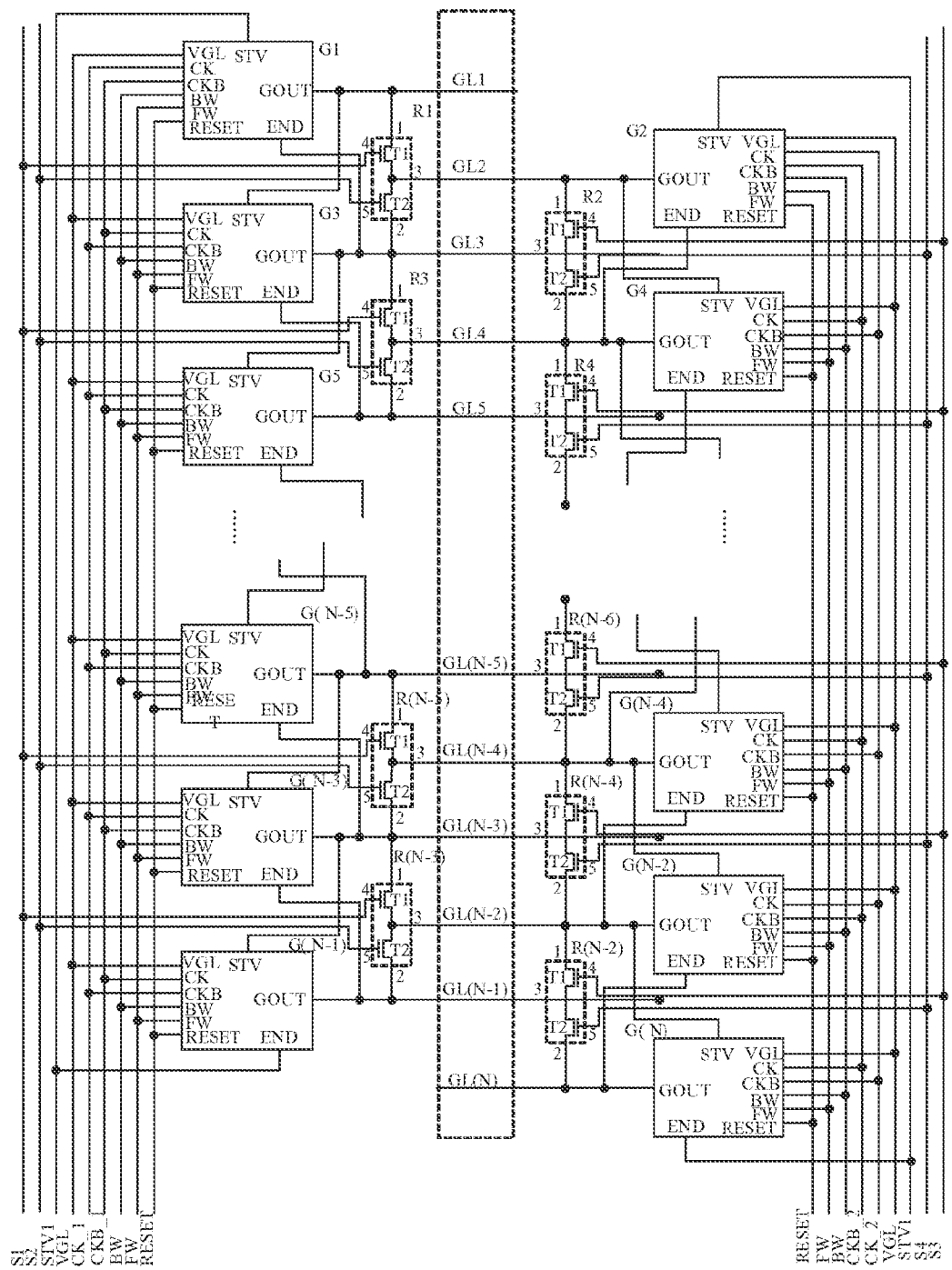
FIG. 3A illustrates a schematic diagram of a first particular gate driver according to an embodiment of the present disclosure.

Referring to FIG. 3A, there is illustrated a first particular gate driver including: N shift register units, each of which is connected with respective one of N gate lines of a display panel, herein the N shift register units are denoted as G1, G2, G3, . . . , G(N−2), G(N−1) and G(N) and the N gate lines are denoted as GL1, GL2, GL3, . . . , GL(N−2), GL(N−1) and GL(N); and N−2 gate units, e.g., R1, R2, R3, . . . , R(N−4), R(N−3) and R(N−2), each of which includes a first TFT T1 and a second TFT T2 in series, herein T1 and T2 are N-type TFTs, a gate, a source and a drain of T1 are connected respectively with a first control end 4, a first end 1 and a third end 3 of the gate unit; and a gate, a source and a drain of T2 are connected respectively with a second control end 5, a second end 2 and the third end 3 of the gate unit. The gate driver provided with enabling signal lines S1 to S4 may be controlled by signals provided on the enabling signal lines S1 to S4, to disable the respective gate units when the gate driver is normal, and to enable the respective gate units when the gate driver becomes abnormal; or may be controlled by the signals provided on the enabling signal lines S1 to S4, to disable and enable the gate units periodically while the gate driver being operating, to thereby repair the gate driver automatically when the gate driver becomes abnormal. Particular examples will be given below.

The gate driver as illustrated in FIG. 3A may be repaired as follows:

When the gate driver is normal (i.e., in normal operation), low level signals are provided on the enabling signal lines S1 to S4 to disable the respective gate units; and when the gate driver becomes abnormal, pulse signals are provided on the enabling signal lines S1 to S4, herein the pulse signals provided on the enabling signal line S1 and the enabling signal line S2 are opposite in phase, and the pulse signals provided on the enabling signal line S3 and the enabling signal line S4 are opposite in phase, that is, T1 is turned on while T2 is turned off, and T1 is turned of while T2 is turned on; and the pulse signals provided on the enabling signal lines S1 to S4 together with respective clock signals (e.g., a clock signal CK_1, a clock signal CKB_1, a clock signal CK_2 and a clock signal CKB_2) turn on or off T1 and T2 sequentially, so that the enabled h-th gate unit R(h) provides the (h+1)-th gate line GL(h+1) with output signals of the h-th shift register unit G(h) and the (h+2)-th shift register unit G(h+2) sequentially.

Alternatively the gate driver as illustrated in FIG. 3A may be repaired as follows:

When the gate driver is either normal or abnormal (either in normal or abnormal operation), pulse signals are provided on the enabling signal lines S1 to S4, herein the pulse signals provided on the enabling signal line S1 and the enabling signal line S2 are opposite in phase, and the pulse signals provided on the enabling signal line S3 and the enabling signal line S4 are opposite in phase, that is, T1 is turned on while T2 is turned off, and T1 is turned off while T2 is turned on; and the pulse signals provided on the enabling signal lines S1 to S4, together with respective clock signals (e.g., a clock signal CK_1, a clock signal CKB_1, a clock signal CK_2 and a clock signal CKB_2), turn on or off T1 and T2 sequentially, so that when the gate driver is normal, an output of the gate driver will not be affected, and when the gate driver becomes abnormal, the enabled h-th gate unit R(h) provides automatically the (h+1)-th gate line GL(h+1) with output signals of the h-th shift register unit G(h) and the (h+2)-th shift register unit G(h+2) sequentially, to thereby repair the abnormal gate driver, herein h=1, 2, 3, . . . , N−2.

For example, the second shift register unit in the gate driver may be repaired in either of the repairing methods above, after it becomes abnormal, as follows.

Figure 3B:
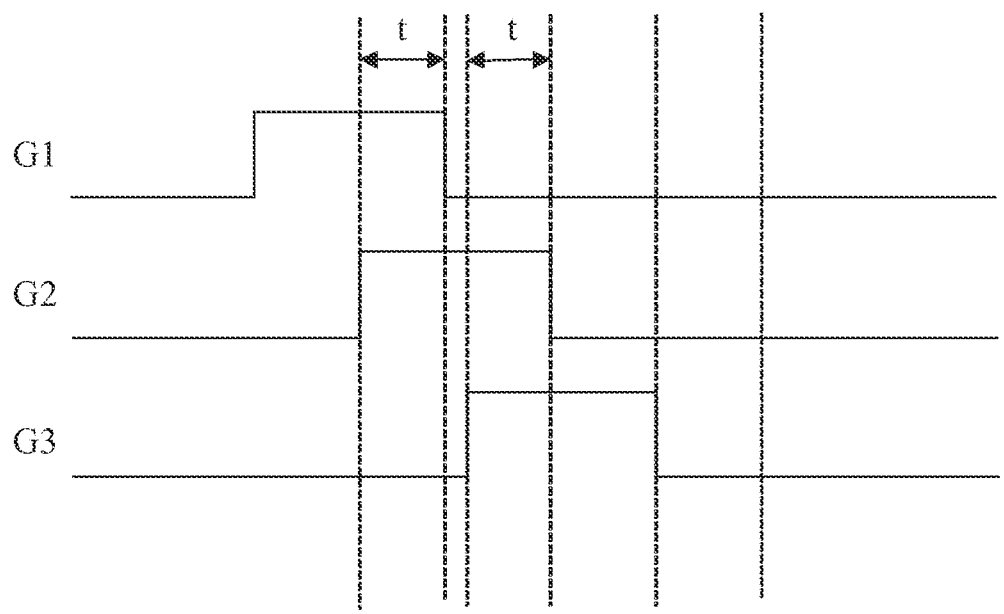
FIG. 3B illustrates a part of a timing diagram of an output of the gate driver in FIG. 3A when it is normal.

FIG. 3B illustrates a timing diagram of outputs of the respective shift register units in the gate driver as illustrated in FIG. 3A when they are normal, and for the sake of a convenient illustration, there are illustrated only an output signal G1 of the first shift register unit, an output signal G2 of the second shift register unit, and an output signal G3 of the third shift register unit, herein the output signal G2 of the second shift register unit overlaps with the output signal Gil of the first shift register unit in a period of time t, and the output signal G3 of the third shift register unit overlaps with the output signal G2 of the second shift register unit in a period of time t.

Figure 3C:
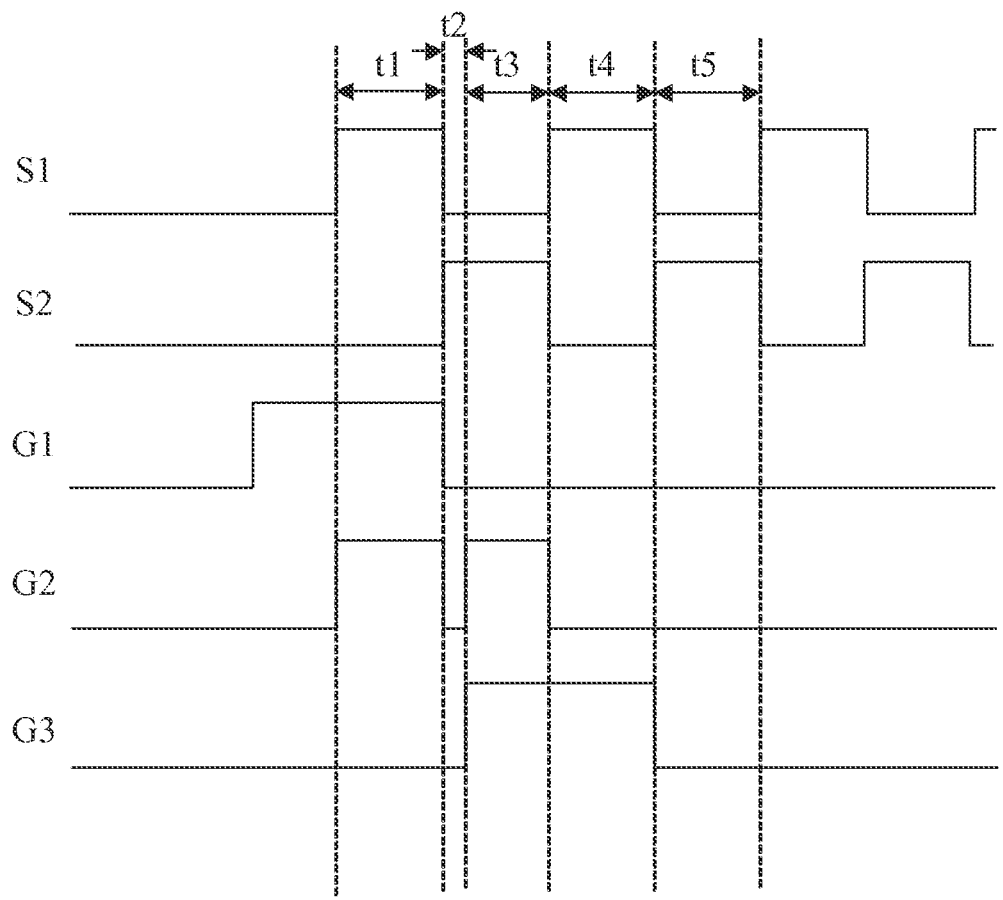
FIG. 3C illustrates a part of a timing diagram of an output of the gate driver in FIG. 3A after the second shift register unit becomes abnormal and is repaired.

FIG. 3C illustrates a part of a timing diagram of an output of the gate driver in FIG. 3A after the second shift register unit becomes abnormal and is repaired, and for the sake of convenient illustration, only an output signal G1 of the first shift register unit, an output signal G2 of the second shift register unit, and an output signal G3 of the third shift register unit are illustrated and described below.

In a period of time t1, the enabling signal S1 is a high level signal, the enabling signal S2 is a low level signal, T1 of the first gate unit is turned on, T2 of the first gate unit is turned off, and the first shift register unit G1 provides the output end of the second shift register unit G2 with a high level signal.

In a period of time t2, the enabling signal S1 is a low level signal, the enabling signal S2 is a high level signal, T1 of the first gate unit is turned off, T2 of the first gate unit is turned on, and since both the first and third shift register units output the low level signals, there is a low level signal at the output end of the second shift register unit G2.

In a period of time t3, the enabling signal S1 is a low level signal, the enabling signal S2 is a high level signal, T1 of the first gate unit is turned off, T2 of the first gate unit is turned on, and the third shift register unit G3 provides the output end of the second shift register unit G2 with a high level signal.

In a period of time t4, the third shift register unit G3 outputs a high level signal.

In a period of time t5, all of the first shift register unit G1, the second shift register unit G2 and the third shift register unit G3 output low level signals.

For the signal output at the output end of the second shift register unit G2 as illustrated in FIG. 3C, a low level signal in the period of time t2 between the period of time t1 and the period of time t3 is needed, but the period of time t2 is not a primary charging period of time, and the period of time t3 is a primary charging period of time, the period of time t3 is equal to a period of time t for which the second shift register unit G2 outputs normally (see FIG. 3B), so a drive capacity of the second shift register unit G2 will not be affected. in the gate driver as illustrated in FIG. 3A, if any of the other shift register units than the first shift register unit and the N-th shift register unit fails, then an output after the shift register unit is repaired will be the same as the output signal of the second shift register unit G2 as illustrated in FIG. 3C.

It shall be noted that in the gate driver as illustrated in FIG. 3C, both T1 and T2 included in a gate unit are P-type TFTs, and accordingly it will suffice if a signal to disable the gate unit is a high level signal when the gate driver as illustrated in FIG. 3A is normal, in either of the methods for repairing the gate driver. In either of the methods for repairing the gate driver as illustrated in FIG. 3A, it will suffice if the timings of the pulse signals provided on the signal lines S1 to S4 are adapted to the respective clock signals, although a repeated description thereof will be omitted here.

Figure 4:
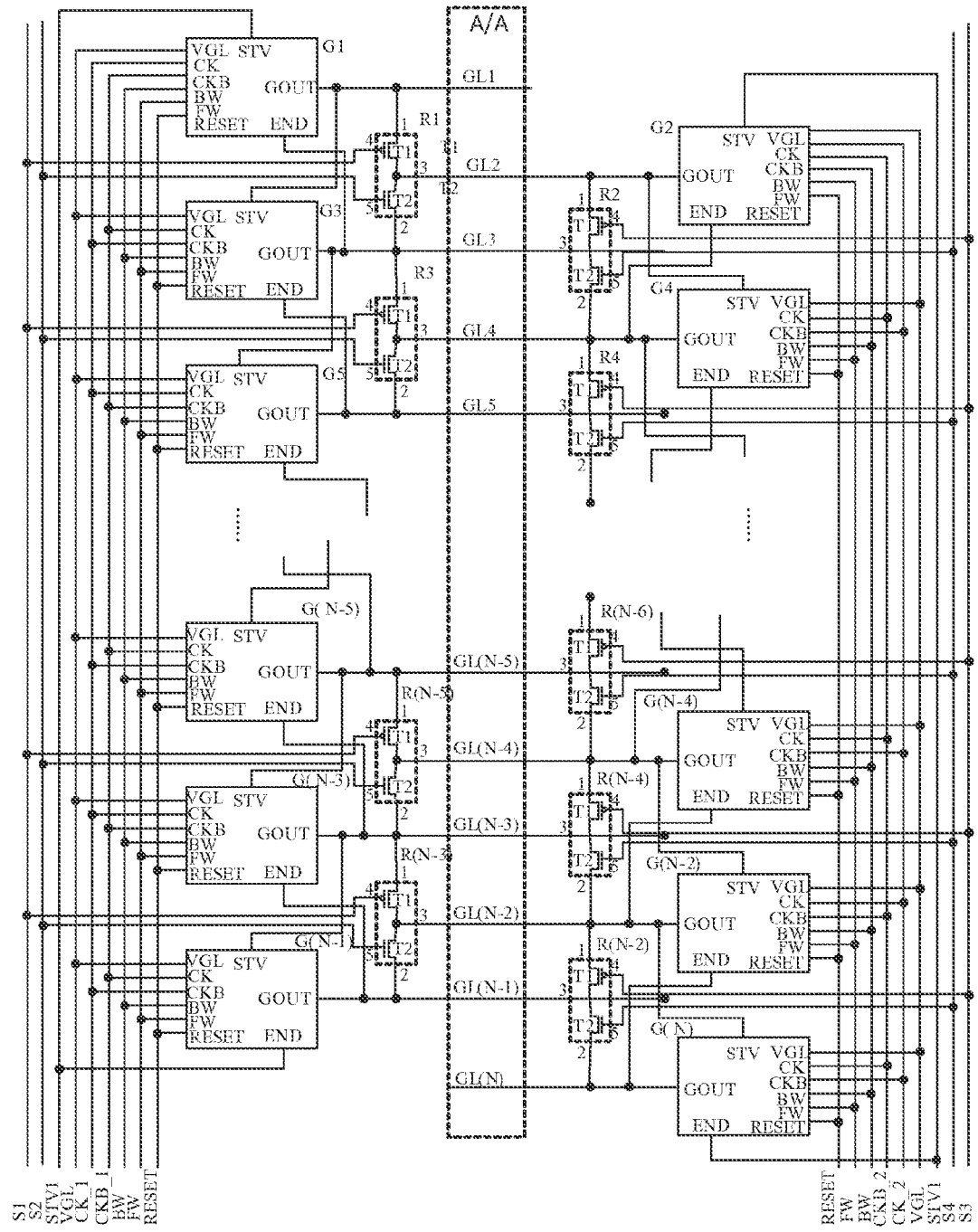
FIG. 4 illustrates a schematic diagram of a second particular gate driver according to an embodiment of the present disclosure.

Referring to FIG. 4, a second particular gate driver includes: N shift register units, each of which is connected with respective one of N gate lines of a display panel, herein the N shift register units are denoted as G1, G2, G3, . . . , G(N−2), G(N−1) and G(N) and the N gate lines are denoted as GL1, GL2, GL3, . . . , GL(N−2), GL(N−1) and GL(N); and N−2 gate units, e.g., R1, R2, R3, . . . , R(N−4), R(N−3) and R(N−2), each of which includes a first TFT T1 and a second TFT T2 connected in series, herein T1 is a P-type TFT, T2 is an N-type TFT, a gate, a source and a drain of T1 are connected respectively with a first control end 4, a first end 1 and a third end 3 of the gate unit; and a gate, a source and a drain of T2 are connected respectively with a second control end 5, a second end 2 and the third end 3 of the gate unit. The gate driver provided with enabling signal lines S1 to S4 may be controlled by signals provided on the enabling signal lines S1 to S4, to disable the respective gate units when the gate driver is normal, and to enable the respective gate units when the gate driver becomes abnormal; or the gate driver may be controlled by the signals provided on the enabling signal lines S1 to S4, to disable and enable the gate units periodically while the gate driver is operating, to thereby repair the gate driver automatically the gate driver becomes abnormal. Particular examples will he given below.

The gate driver as illustrated in FIG. 4 may be repaired as follows:

When the gate driver is normal, high level signals are provided on the enabling signal lines S1 and S3, and low level signals are provided on the enabling signal lines S2 and S4, to disable the respective gate units; and when the gate driver becomes abnormal, pulse signals are provided on the enabling signal lines S1 to S4, herein the pulse signals provided on the enabling signal tine S1 and the enabling signal line S2 are the same in phase, and the pulse signals provided on the enabling signal line S3 and the enabling signal line S4 are the same in phase, that is, T1 is turned on while T2 is turned off, and T1 is turned of while T2 is turned on; and the pulse signals provided on the enabling signal lines S1 to S4, together with respective clock signals (e.g., a clock signal CK_1, a clock signal CKB_1, a clock signal CK_2 and a clock signal CKB_2), turn on or off T1 and T2 sequentially, so that the enabled h-th gate unit R(h) provides the (h+1)-th gate line GL(h+1) with output signals of the h-th shift register unit G(h) and the (h+2)-th shift register unit G(h+2) sequentially.

Alternatively the gate driver as illustrated in FIG. 4 may be repaired as follows:

When the gate driver is either normal or abnormal, pulse signals are provided on the enabling signal lines S1 to S4, herein the pulse signals provided on the enabling signal line S1 and the enabling signal line S2 are the same in phase, and the pulse signals provided on the enabling signal line S3 and the enabling signal line S4 are the same in phase, that is, T1 is turned on while T2 is turned off, and T1 is turned of while T2 is turned on; and the pulse signals provided on the enabling signal lines S1 to S4, together with respective clock signals (e.g., a clock signal CK_1, a clock signal CKB_1, a clock signal CK_2 and a clock signal CKB_2), turn on or off T1 and 12 sequentially, so that when the gate driver is normal, an output of the gate driver will not be affected, and when the gate driver becomes abnormal, the enabled h-th gate unit R(h) provides automatically the (h+1)-th gate line GL(h+1) with output signals of the h-th shift register unit G(h) and the (h+2)-th shift register unit G(h+2) sequentially, to thereby repair the abnormal gate driver. In fact, when the gate driver is either normal or abnormal, the pulse signals are provided on the enabling signal lines S1 to S4, herein the pulse signals provided on the enabling signal line S1 and the enabling signal line S2 are the same in phase, and the pulse signals provided on the enabling signal line S3 and the enabling signal line S4 are the same in phase, so it will suffice if the first control ends and the second control ends of the gate units are provided with the pulse signals on only one enabling signal line, although a repeated description thereof will be omitted here.

it shall be noted that in the gate driver as illustrated in FIG. 4, alternatively T1 included in a gate unit may be an N-type TFT, and T2 may be a P-type TFT, and accordingly it will suffice if a signal to disable T1 is a low level signal and a signal to disable T2 is a high level signal when the gate driver as illustrated in FIG. 4 is normal, in either of the methods for repairing the gate driver. in either of the methods for repairing the gate driver as illustrated in FIG. 4, it will suffice if the timings of the pulse signals provided on the signal lines S1 to S4 are adapted to the respective clock signals, although a repeated description thereof will be omitted here.

Figure 5:
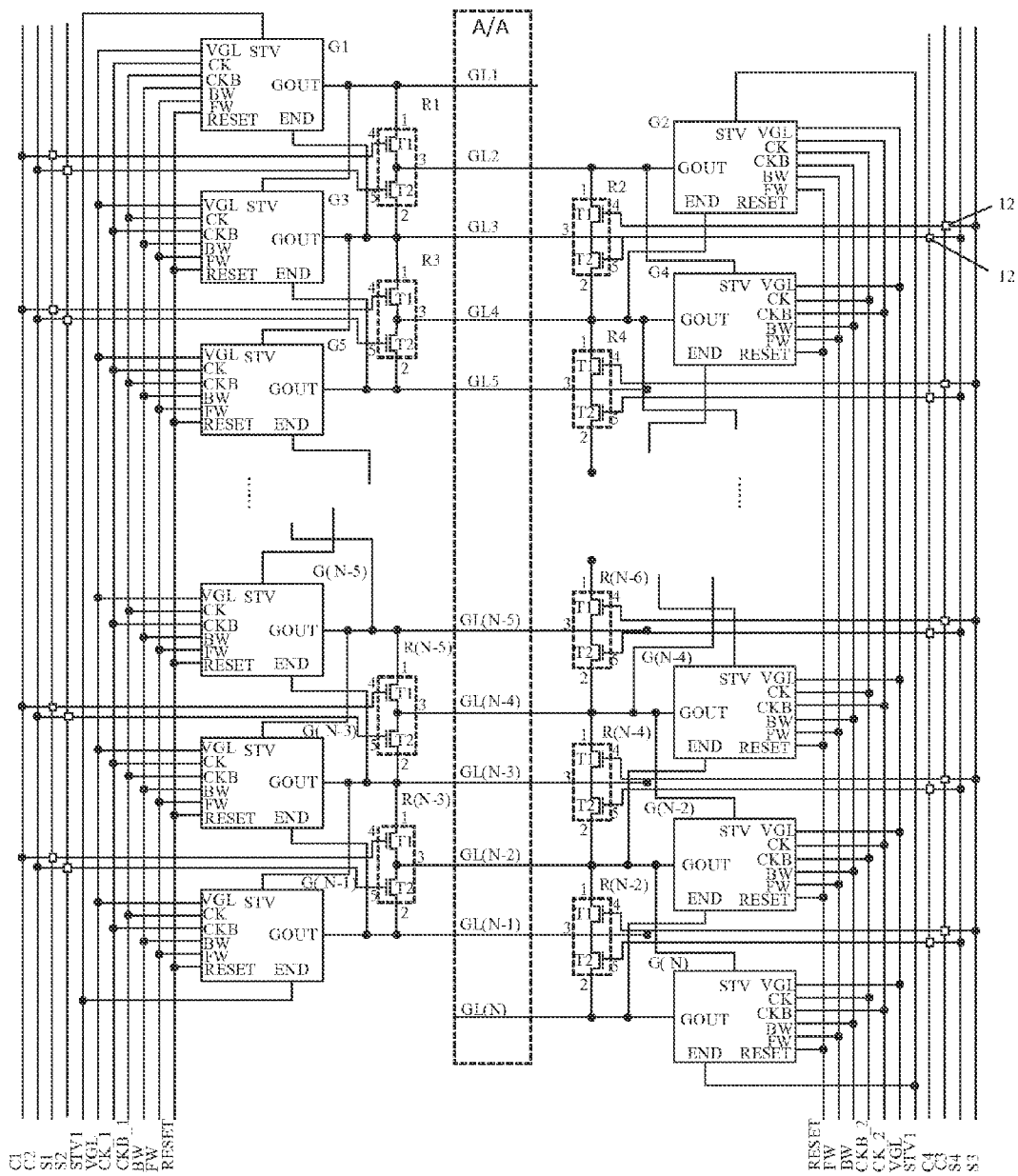
FIG. 5 illustrates a schematic diagram of a third particular gate driver according to an embodiment of the present disclosure.

FIG. 5 shows a third particular gate driver, which is a variant of the gate driver in FIG. 3A, but different from the gate driver in FIG. 3A, in that the gate driver is provided with both the enabling signal lines S1 to S4 and disabling signal lines C1 to C4, herein the first control ends 4 and the second control ends 5 of the odd gate units are connected respectively with the disabling signal lines C1 and C2, and the first control ends 4 and the second control ends 5 of the even gate units are connected respectively with the disabling signal lines C3 and C4, so low level signals are provided on the disabling signal lines C1 to C4, to thereby turn off the N-type TFTs included in the respective gate units. Moreover connection lines extending from the control ends (e.g., the first control ends 4 and the second control ends 5) of the gate units intersect with the enabling signal lines S1 and S2, or the enabling signal lines S3 and S4, at intersections where they are insulated from each other and fusing points 12 are formed.

Figure 6:
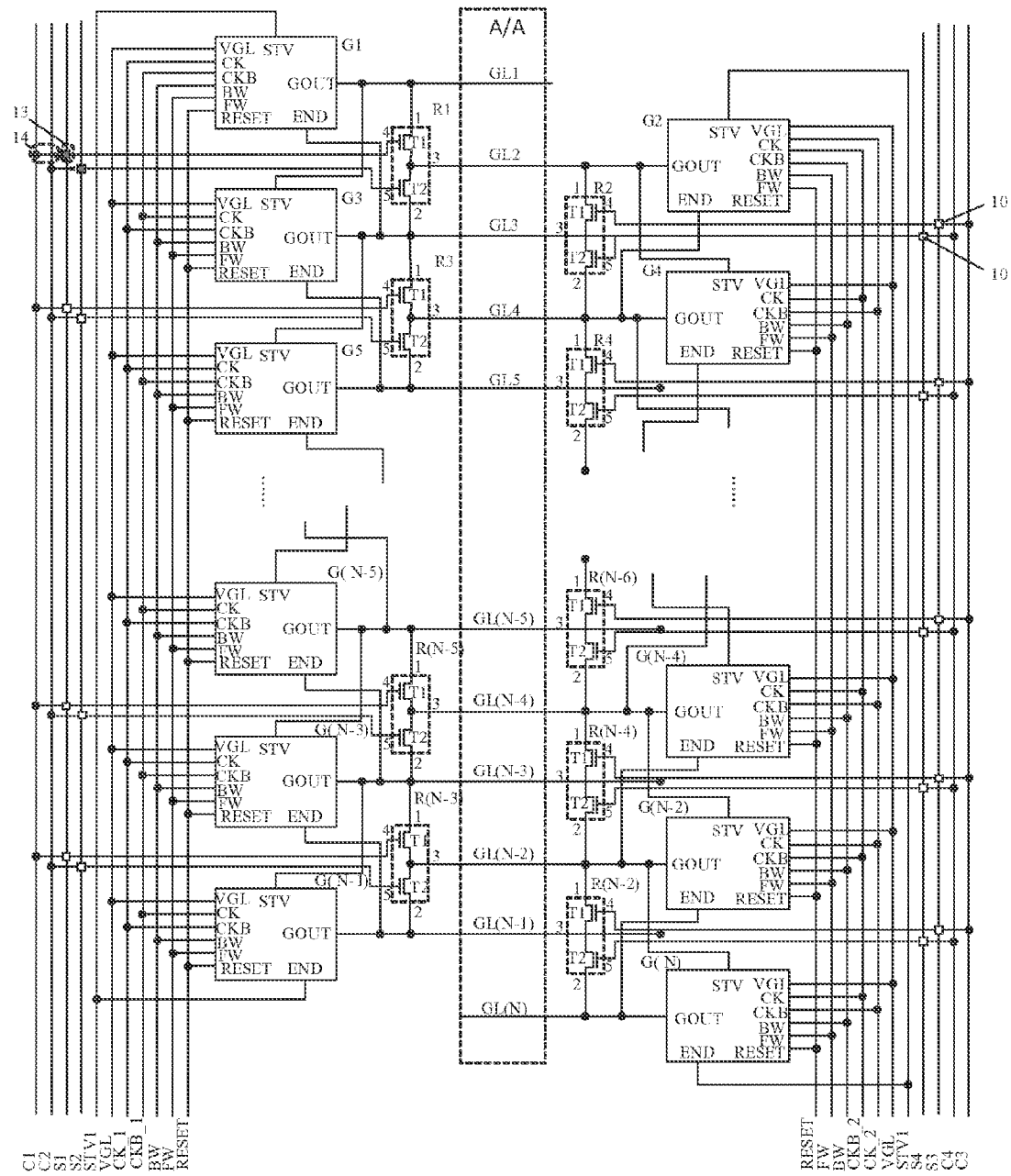
FIG. 6 illustrates a schematic diagram of the gate driver in FIG. 5 after it is repaired.

When the gate driver is abnormal (i.e., in abnormal operation), the control ends (e.g., the first control ends 4 and the second control end 5) of a gate unit adaptable to an output of an abnormal shift register unit are disconnected from the disabling signal lines (e.g., the disabling signal lines C1 and C2 or the disabling signal lines C3 and C4), at disconnection points 14 as illustrated in FIG. 6; and the control ends of the gate unit are connected with the enabling signal lines (e.g., the enabling signal lines S1 and S2 or the enabling signal lines S3 and S4) at fuse points 110, thus forming connection points 13 as illustrated in FIG. 6, so that pulse signals are provided on the enabling signal lines.

Alternatively, with the gate driver as illustrated in FIG. 4, when the gate driver is normal, disabling signals may be provided on the disabling signal lines to disable the gate units; and when the gate driver becomes abnormal, pulse signals are provided on the enabling signal lines to enable the gate units to operate, and the variant of the gate driver has a structure and a. repairing principle similar to the gate driver as illustrated in FIG. 5, although a repeated description thereof will be omitted here.

Figure 7:
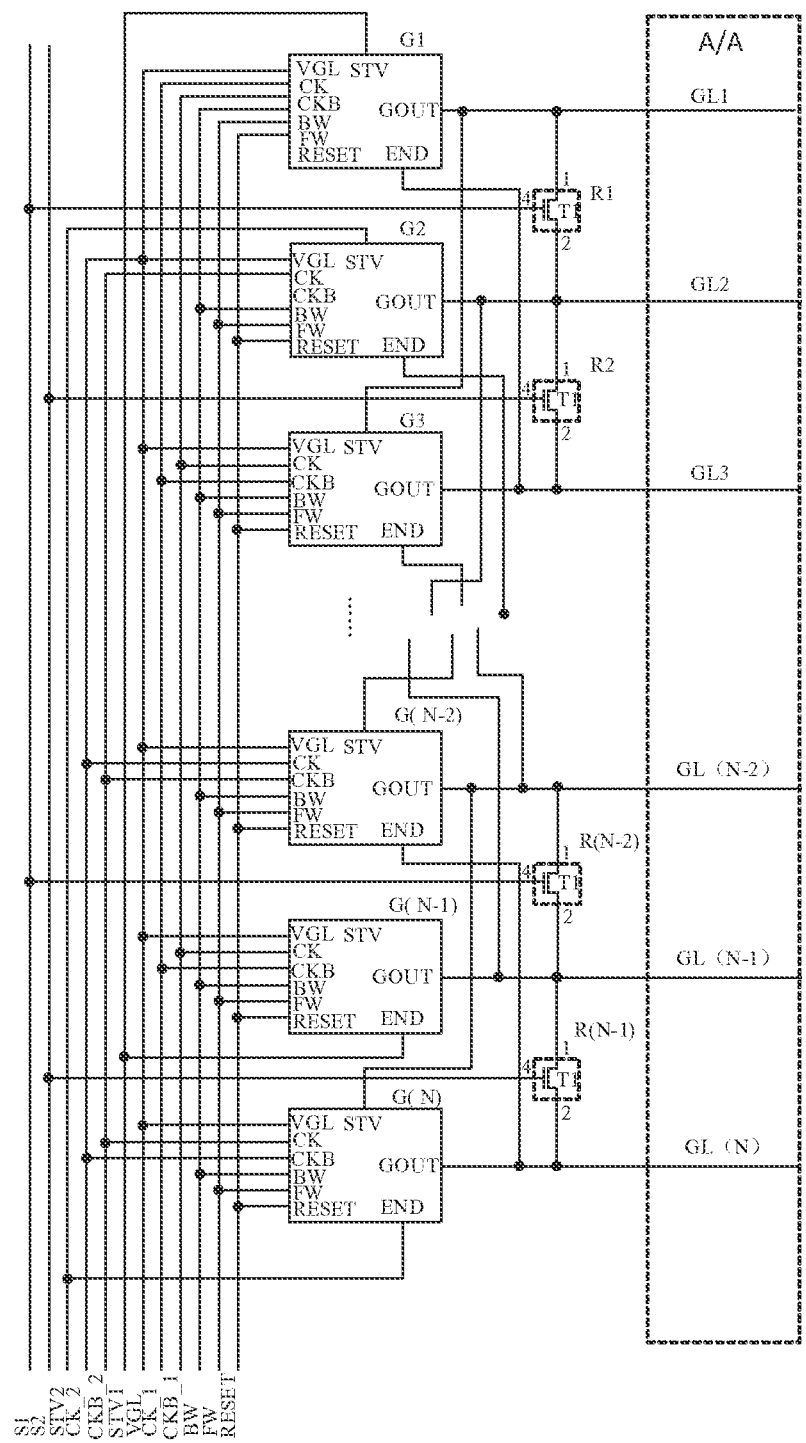
FIG. 7 illustrates a schematic diagram of a fourth particular gate driver according to an embodiment of the present disclosure.

Referring to FIG. 7, a fourth particular gate driver includes: N shift register units, each of which is connected with respective one of N gate lines of a display panel, herein the N shift register units are denoted as G1, G2, G3, ..., G(N−2), G(N−1) and G(N) and the N gate lines are denoted as GL1, GL2, GL3, ..., GL(N−2), GL(N−1) and GL(N); and N−1 gate units, e.g., R1, R2, R3, ..., R(N−4), R(N−3) and R(N−2), respective one of which is disposed between output ends of every two adjacent shift register units, herein each gate unit includes a first TFT T1, and all the T1 may be N-type TFTs as illustrated in FIG. 7. A gate, a drain and a source of T1 are connected respectively with a first control end 4, a first end 1 and a second end 2 of the gate unit. In the case that the first TFTs of all the gate units are N-type TFTs, the gate driver needs to be provided with two enabling signal lines, e.g., enabling signal lines S1 and S2, so that the odd-numbered. gate units and the even-numbered gate units may be enabled at different instances of time. The gate driver may be controlled by signals provided on the enabling signal lines S1 and S2, to disable the respective gate units when the gate driver is normal, and to enable the respective gate units when the gate driver becomes abnormal; or the gate driver may be controlled by the signals provided on the enabling signal lines S1 and S2, to disable and enable the gate units periodically while the gate driver is operating, to thereby repair the gate driver automatically when the gate driver becomes abnormal.

The gate driver as illustrated in FIG. 7 may be repaired as follows:

When the gate driver is normal, low level signals are provided on the enabling signal lines S1 and S2 to disable the respective gate units; and when the gate driver becomes abnormal, pulse signals are provided on the enabling signal lines S1 and S2, herein the pulse signals provided on the enabling signal line S1 and the enabling signal line S2 are opposite in phase, that is, the odd-numbered T1 is turned on while the even-numbered T1 is turned off, and the odd-numbered numbered T1 is turned off while the even-numbered T1 is turned on; and the pulse signals provided on the enabling signal lines S1 and S2, together with respective clock signals (e.g., a clock signal CK_1, a clock signal CKB_1, a clock signal CK_2 and a clock signal CKB_2), turn on or off the odd T1 and the even T2 sequentially, so that the enabled k-th gate unit R(k) and (k+1)-th gate unit R(k+1) provide the (k+1)-th gate line GL(k+1), herein k=1, 2, 3, ..., N−1, with output signals of the k-th shift register unit G(k) and the (k+2)-th shift register unit G(k+2) sequentially.

Alternatively, the gate driver as illustrated in FIG. 7 may be repaired as follows:

When the gate driver is either normal or abnormal, pulse signals are provided on the enabling signal lines S1 and S2, herein the pulse signals provided on the enabling signal line S1 and the enabling signal line S2 are opposite in phase, that is, the odd T1 is turned on while the even T1 is turned off, and the odd T1 is turned off while the even T1 is turned on; and the pulse signals provided on the enabling signal lines S1 and S2, together with respective clock signals (e.g., a clock signal CK_1, a clock signal CKB_1, a clock signal CK_2 and a clock signal CKB_2), turn on or off the odd T1 and the even T2 sequentially, so that when the gate driver is normal, an output of the gate driver will not be affected, and when the gate driver becomes abnormal, the enabled k-th gate unit R(k) and (k+1)-th gate unit R(k+1) provide the (k+1)-th gate line GL(k+1), herein k=1, 2, 3, ..., N−1, with output signals of the k-th shift register unit G(k) and the (k+2)-th shift register unit G(k+2) sequentially to thereby repair the abnormal gate driver.

It shall be noted that in the gate driver as illustrated in FIG. 7, T1 included in all the gate units may alternatively be P-type TFTs, and accordingly it will suffice if a signal to disable a gate unit when the gate driver is normal is a high level signal, in either of the methods for repairing the gate driver as illustrated in FIG. 7. Alternatively T1 included in the odd-numbered. gate units are N-type/P-type TFTs, and T1 included in the even-numbered gate units are P-type/N-type TFTs, and accordingly it will suffice if the odd-numbered gate units and the even-numbered gate units are provided with a low level signal or a high level signal on the respective enabling signal lines, dependent upon the type of the T1, in either of the methods for repairing the gate driver as illustrated in FIG. 7.

The gate driver as illustrated in FIG. 7 may be further provided with disabling signal lines as illustrated in FIG. 5 (e.g., the disabling signal lines C1 to C4), the number of which may be set flexibly dependent upon the type of the T1 included in the respective gate units in the gate driver, with a similar modification to FIG. 5, although a repeated description thereof will be omitted here.

Figure 8:
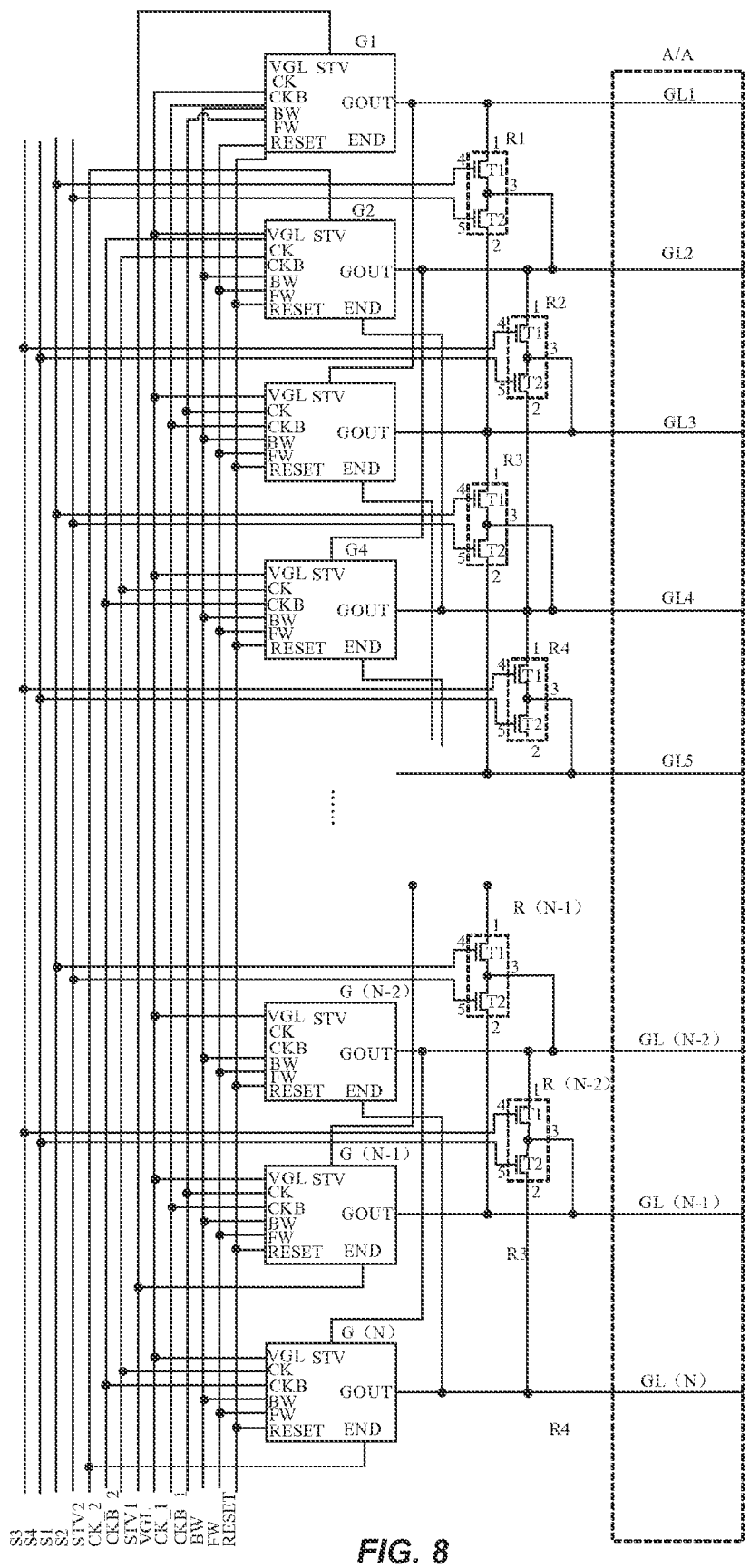
FIG. 8 illustrates a schematic diagram of a fifth particular gate d according to an embodiment of the present disclosure.

The gate drivers illustrated in FIG. 3A to FIG. 7 may be varied as needed for a design, so that with reference to a display area A/A of the display panel, the odd-numbered shift register units and the even-numbered shift register units may be disposed respectively to the left and the right of the display area A/A, or both the odd-numbered shift register units and the even-numbered shift register units may be disposed to the left side or the right of the display area A/A. Referring to FIG. 8, there is illustrated a fifth particular gate driver derived from the gate driver illustrated in FIG. 3A, that is, both the shift register units disposed respectively to the left and the right of the display area A/A in the gate driver illustrated in FIG. 3A are disposed to the left of the display area A/A, and an operating principle and a repairing method of the gate driver as illustrated in FIG. 8 will be the same as the gate driver as illustrated in FIG. 3A. Similarly, the gate drivers as illustrated in FIG. 4 to FIG. 6 may be varied as illustrated in FIG. 8, so that the respective shift register units are disposed on a side of the display area A/A; and in the gate driver as illustrated in FIG. 7, the odd-numbered shift register units and the even-numbered shift register units may be disposed respectively on the left and the right of the display area A/A, and reference may be made to FIG. 3C for timings of outputs of the gate drivers as illustrated in FIG. 4 to FIG. 8 after they are repaired, although a repeated description thereof be omitted here.

Figure 9:
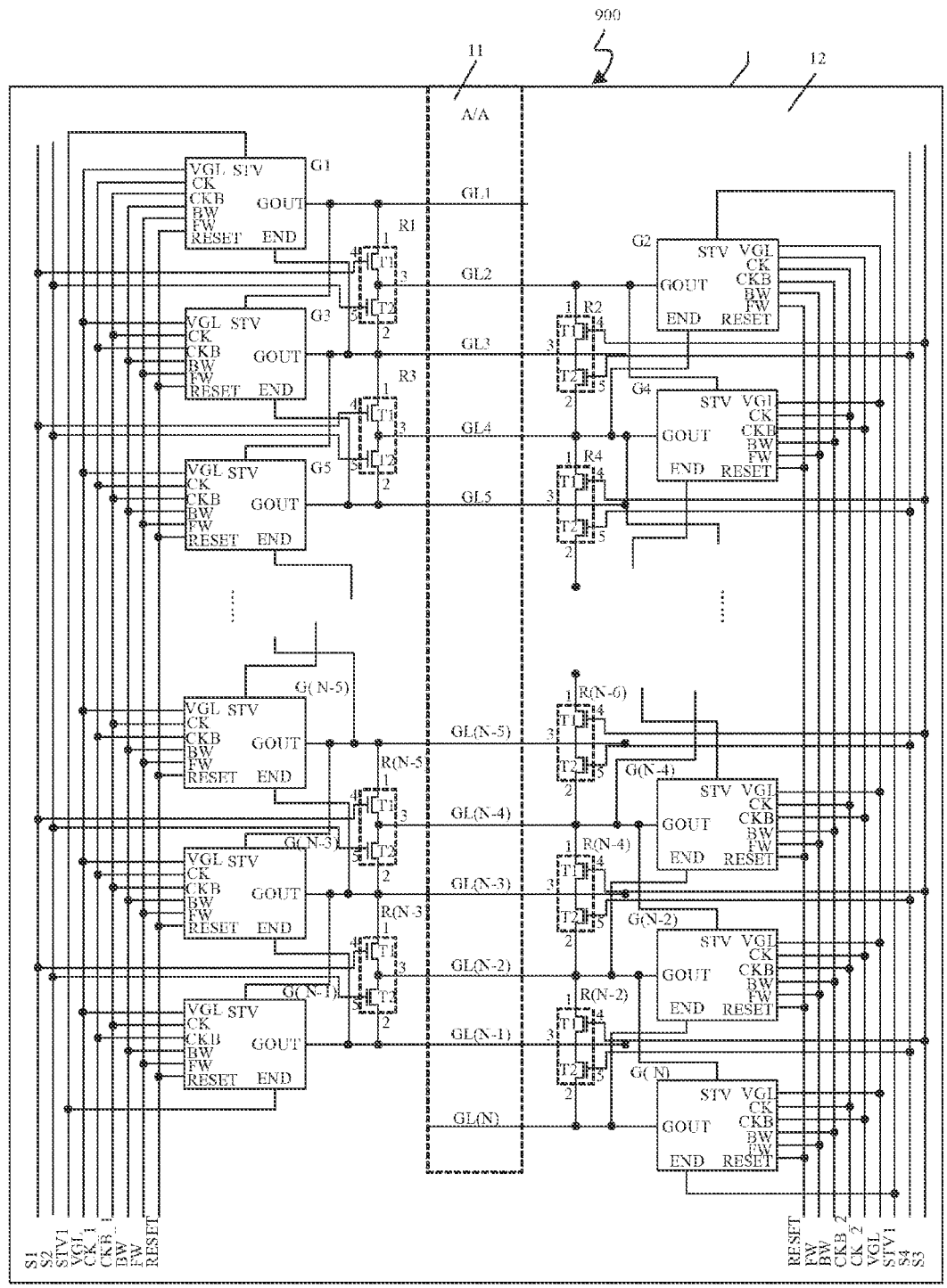
FIG. 9 illustrates a schematic diagram of a first display panel according to an embodiment of the present disclosure.

FIG. 9 illustrates a display panel 900 according to an embodiment of the present disclosure. The display panel includes a display area (A/A) 11 in which N gate lines (GL1, GL2, . . . , GL(N−1) and GL(N)) are disposed, and an array substrate 1, on which the gate driver according to any embodiments above of the present disclosure, in a non-display area 12 surrounding the display area (A/A) 11, herein an output signal end of each of N shift register units (G1, G2, . . . , G(N−1) and G(N)) of the gate driver is connected with respective one of the N gate lines.

The respective shift register units connected with the odd-numbered gate lines are disposed in the non-display area 12 on the left side of the display area 11, and the respective shift register units connected with the even-numbered gate lines are disposed in the non-display area 12 on the right side of the display area 11.

The display panel as illustrated in FIG. 9 has been described taking the gate driver as illustrated in FIG. 3A as an example, and the same will be also applicable to the gate drivers as illustrated in FIG. 4 to FIG. 8. For example, the respective shift register units connected with the odd-numbered gate lines are disposed in the non-display area 12 on the right side of the display area 11, and the respective shift register units connected with the even-numbered gate lines are disposed in the non-display area 12 on the left side of the display area 11.

Figure 10:
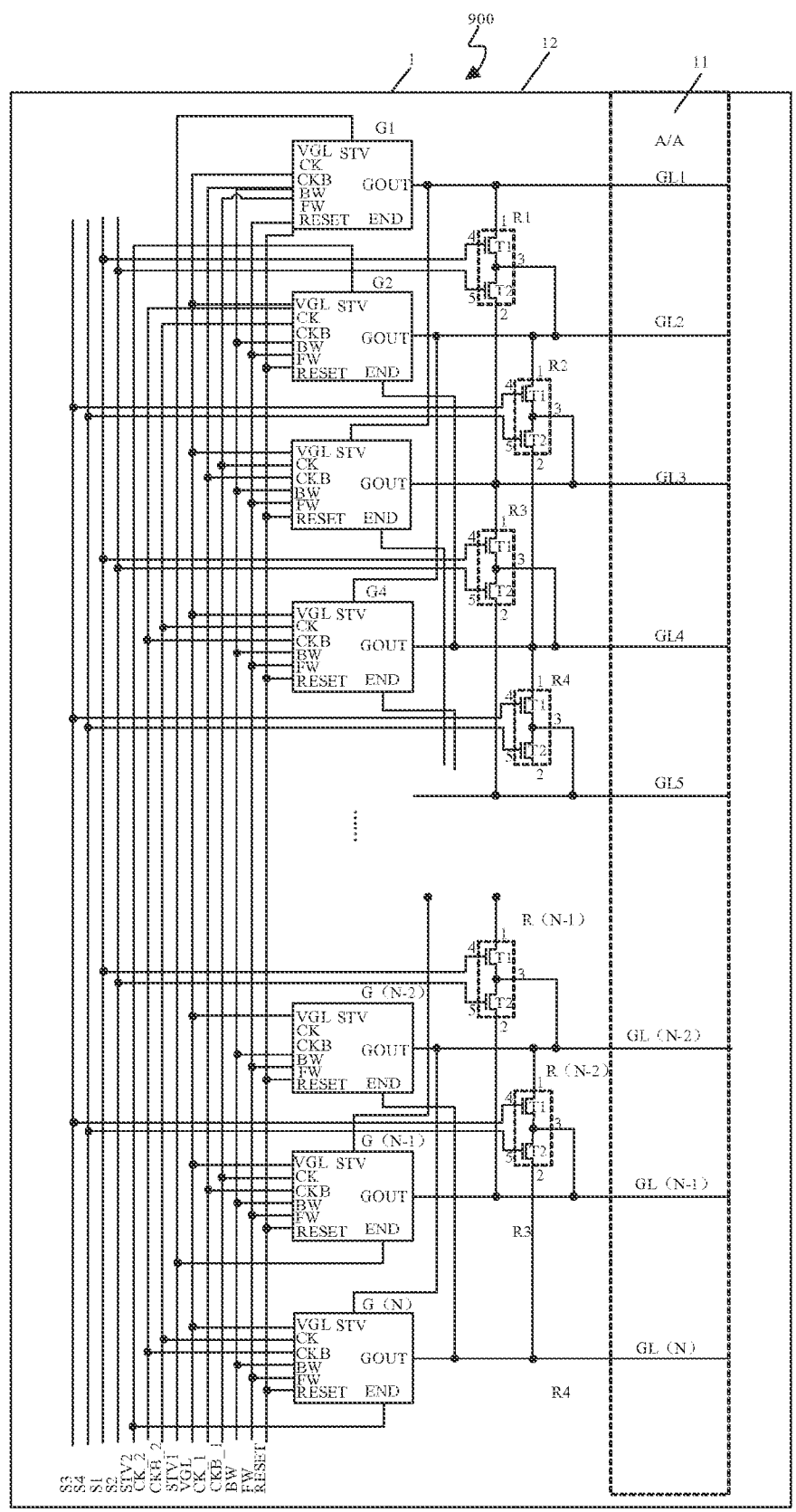
FIG. 10 illustrates a schematic diagram of a second display panel according o an embodiment of the present disclosure.

FIG. 10 (with the same reference numbers as in FIG. 9) illustrates a second display panel 900' including respective shift register units disposed on a side of the display area 11, and the display panel as illustrated in FIG. 10 is fabricated using the gate driver as illustrated in FIG. 8.

Advantageous effects of embodiments of the present disclosure are as follows: the plurality of gate units are disposed in the gate driver, and when the corresponding shift register unit connected with the current gate line becomes abnormal, corresponding one of the gate units provides the current gate line with the output signal of the corresponding shift register unit connected to the preceding gate line and/or the corresponding shift register unit connected to the succeeding gate line, to thereby improve the ability to repair the gate driver, and avoid the entire GOA circuit from operating improperly or becoming inoperative due to some abnormal shift register unit.

Figure 11:
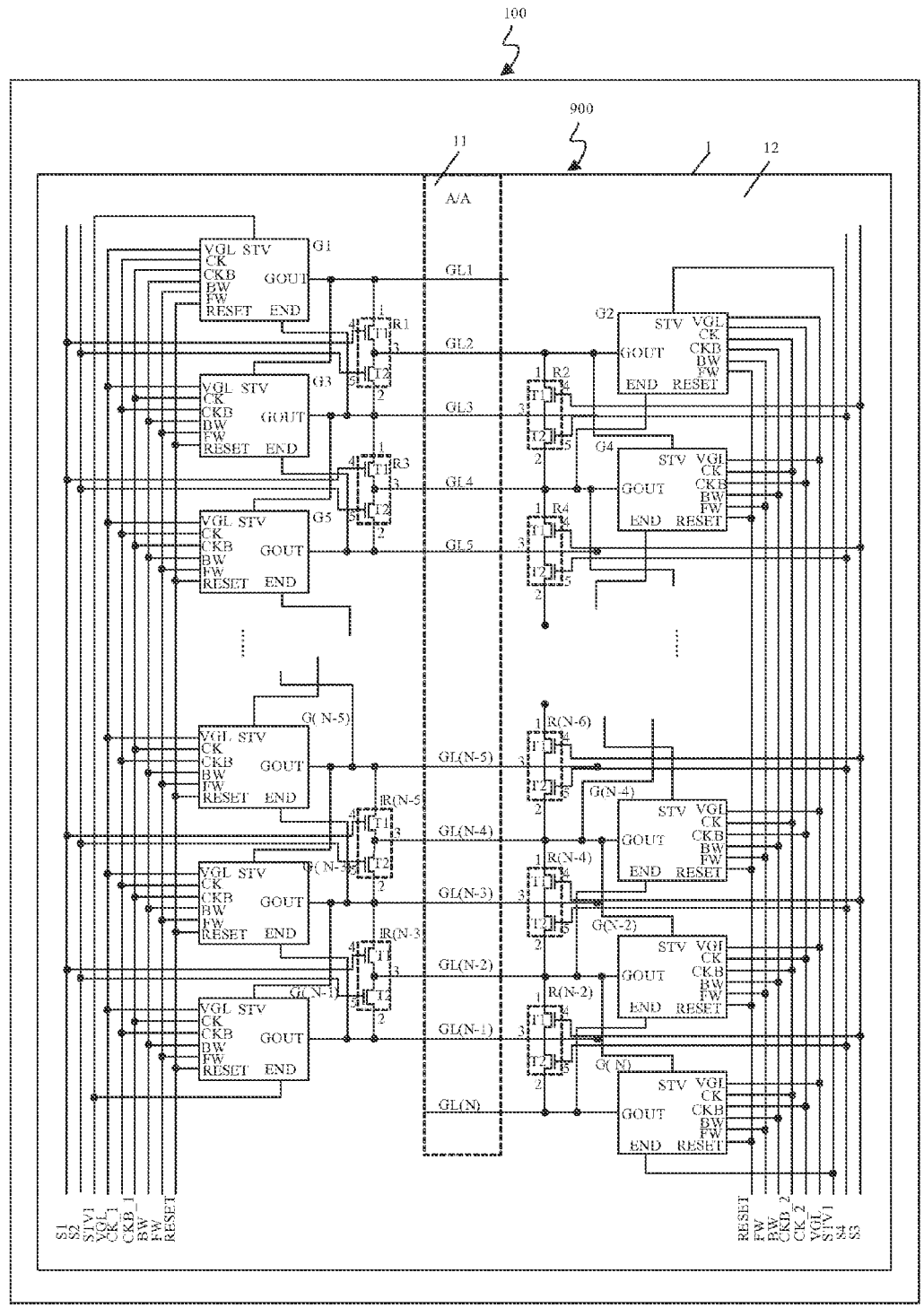
FIG. 11 illustrates a schematic diagram of a display device according to an embodiment of the present disclosure.

FIG. 11 illustrates a display device 100 that may include the display panel according to the above-described embodiments of the present disclosure.

Embodiments of the present disclosure have the following advantages: the gate units are disposed in the gate driver, and when the corresponding shift register unit connected with the current gate line becomes abnormal, corresponding one of the gate units provides the current gate line with the output signal of the corresponding shift register unit connected to the preceding gate line and/or the corresponding shift register unit connected to the succeeding gate line, to thereby improve the ability to repair the gate driver, and avoid the entire GOA circuit from operating improperly or becoming inoperative due to some abnormal shift register unit.

Evidently those skilled in the art may make various modifications and variations to the present disclosure without departing from the essence and scope of the present disclosure. Thus the present disclosure is also intended to encompass these modifications and variations thereto so long as the modifications and variations come into the scope of the claims appended to the present disclosure and their equivalents.

What is claimed is:

1. A gate driver, comprising N shift register units, each of which being connected with respective one of N gate lines of a display panel, wherein the gate driver comprises a plurality of gate units, and while a gate unit is enabled, the gate unit is configured to provide a current gate line with an output signal of a corresponding shift register unit connected to a preceding gate line and/or an output signal of a corresponding shift register unit connected to a succeeding gate line instead of an output signal of a corresponding shift register unit connected to the current gate line, N being an integer greater than 2, wherein the gate driver comprises (N−2) gate units, an h-th of the gate units disposed between an h-th shift register unit and an (h+2)-th shift register unit, a first end of the h-th gate unit is connected with an output signal end of the h-th shift register unit, a second end of the h-th gate unit is connected with an output signal end of the (h+2)-th shift register unit, and a third end of the h-th gate unit is connected with an (h+1)-th gate line; and the h-th gate unit, when enabled, provides the (h+1)-th gate line, sequentially with output signals of the h-th shift register unit and the (h+2)-th shift register unit, wherein h=1 2,3, . . . , (N−2).

2. The gate driver according to claim 1, wherein each of the (N−2) gate units comprises a first TFT and a second TFT, a gate, a source and a drain of the first TFT are connected respectively with a first control end, a first end and a third end of the gate unit, and a gate, and a source and a drain of the second TFT are connected respectively with a second control end, a second end and the third end of the gate unit; and the first TFT and the second TFT are turned on or off respectively by enabling signals received at the first control end and the second control end of the gate unit.

3. The gate driver according to claim 2, wherein the disabling signals are received at the first control end and the second control end of the gate unit respectively through a first connection line and a second connection line, wherein the first connection line and the second connection line intersect each other, and are insulated from, enabling signal lines on which the first control end and the second control end of the gate unit are provided with the enabling signals, wherein fuse points are formed at intersections of the first and second connection lines.

4. The gate driver according to claim 2, wherein the first TFTs are N-type/P-type TFTs, and the second TFTs are P-type/N-type TFTs; or both the first TFTs and the second TFTs are P-type TFTs or N-type TFTs.

5. The gate driver according to claim 1, wherein the gate driver comprises (N−1) gate units, respective one of which being disposed between output ends of every two adjacent shift register units: both a second end of a k-th gate unit and a first end of a (k+1)-th gate unit being connected with the (k+1)-th gate line, a first end of the k-th gate unit being connected with an output signal end of a k-th shift register unit, and a second end of the (k+1)-th gate unit is connected with an output signal end of a (k+2)-th shift register unit; and the k-th gate unit and (k+1)-th gate unit, when enabled, provide the (k+1)-th gate line with output signals of the k-th shift register unit and the (k+2)-th shift register unit sequentially, wherein k=1, 2, 3, . . . , (N−1).

6. The gate driver according to claim 5, wherein each of the (N−1) gate units only comprises a TFT, a gate, a source and a drain of the TFT being connected respectively with a control end, a first end and a second end of the gate unit, and the TFT being turned on or off by an enabling signal received at the control end of the gate unit.

7. The gate driver according to claim 6, wherein the TFTs are N-type TFTs or P-type TFTs; or the TFTs of odd-numbered gate units are N-type/P-type TFTs, and the TFTs of even-numbered gate units are P-type/N-type TFTs.

8. An array substrate, comprising a display area in which N gate lines are disposed, and a non-display area surrounding the display area, wherein a gate driver comprises N shift register units, each of which being connected with respective one of N gate lines of a display panel, wherein the gate driver comprises a plurality of gate units, and while a gate unit is enabled, the gate unit is configured to provide a current gate line with an output signal of a corresponding shift register unit connected to a preceding gate line and/or an output signal of a corresponding shift register unit connected to a succeeding gate line instead of an output signal of a corresponding shift register unit connected to the current gate line, N being an integer greater than 2, wherein the gate driver comprises (N−2) gate units, an h-th of the gate units disposed between an h-th shift register unit and an (h+2)-th shift register unit, a first end of the h-th gate unit is connected with an output signal end of the h-th shift register unit, a second end of the h-th gate unit is connected with an output signal end of the (h+2)-th shift register unit, and a third end of the h-th gate unit is connected with an (h+1)-th gate line; and the h-th gate unit, when enabled, provides the (h+1)-th gate line, sequentially with output signals of the h-th shift register unit and the (h+2)-th shift register unit, wherein h=1, 2, 3, . . . , (N−2).

9. The array substrate according to claim 8, wherein the gate driver is disposed in the non-display area on the left side or the right side of the display area; or respective shift register units connected with odd-numbered gate lines are disposed in the non-display area on the left/light side of the display area, and the respective shift register units connected with even-numbered gate lines are disposed in the non-display area on the right/left side of the display area.

10. A display panel, comprising an array substrate, wherein the array substrate comprises a display area in which N gate lines are disposed, and a non-display area surrounding the display area, wherein a gate driver comprises N shift register units, each of which being connected with respective one of N gate lines of a display panel, wherein the gate driver comprises a plurality of gate units, and while a gate unit is enabled, the gate unit is configured to provide a current gate line with an output signal of a corresponding shift register unit connected to a preceding gate line and/or an output signal of a corresponding shift register unit connected to a succeeding gate line instead of an output signal of a corresponding shift register unit connected to the current gate line, N being an integer greater than 2, wherein the gate driver comprises (N−2) gate units, an h-th of the gate units disposed between an h-th shift register unit and an (h+2)-th shift register unit, a first end of the h-th gate unit is connected with an output signal end of the h-th shift register unit, a second end of the h-th gate unit is connected with an output signal end of the (h+2)-th shift register unit, and a third end of the h-th gate unit is connected with an (h+1)-th gate line; and the h-th gate unit, when enabled, provides the (h+1)-th gate line, sequentially with output signals of the h-th shift register unit and the (h+2)-th shift register unit, wherein h=1, 2, 3, . . . , (N−2).

11. A display device, comprising the display panel according to claim 10.

* * * * *